United States Patent
Jin et al.

(10) Patent No.: US 12,074,230 B2
(45) Date of Patent: Aug. 27, 2024

(54) SOLAR CELL, METHOD FOR MANUFACTURING SOLAR CELL, AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Jingsheng Jin, Zhejiang (CN); Bike Zhang, Zhejiang (CN); Xinyu Zhang, Zhejiang (CN)

(73) Assignees: ZHEJIANG JINKO SOLAR CO., LTD., Haining Zhejiang (CN); JINKO SOLAR CO., LTD., Jiangxi (CN)

(*) Notice: Subject to any disclaimer, the term of this patent is extended or adjusted under 35 U.S.C. 154(b) by 0 days.

(21) Appl. No.: 17/960,719

(22) Filed: Oct. 5, 2022

(65) Prior Publication Data

US 2024/0047587 A1    Feb. 8, 2024

(30) Foreign Application Priority Data

Aug. 5, 2022 (CN) .......................... 202210938933.X

(51) Int. Cl.
*H01L 31/02* (2006.01)
*H01L 31/0224* (2006.01)
*H01L 31/0468* (2014.01)

(52) U.S. Cl.
CPC .... *H01L 31/02021* (2013.01); *H01L 31/0224* (2013.01); *H01L 31/0468* (2014.12)

(58) Field of Classification Search
CPC .......... H01L 31/02167; H01L 31/0747; H01L 31/0745; H01L 31/077; H01L 31/0468; H01L 31/02021; H01L 31/0224
See application file for complete search history.

(56) References Cited

U.S. PATENT DOCUMENTS 7,468,485 B1    12/2008    Swanson
11,189,739 B1   11/2021    Jin et al.
(Continued)

FOREIGN PATENT DOCUMENTS

CN    102856328 A    1/2013
CN    102986042 A    3/2013
(Continued)

OTHER PUBLICATIONS

CN-204029820-U English machine translation (Year: 2014).*
(Continued)

*Primary Examiner* — Andrew J Golden
(74) *Attorney, Agent, or Firm* — USCH Law, PC

(57) ABSTRACT

A solar cell, a method for manufacturing the solar cell, and a photovoltaic module are provided. The solar cell includes a substrate, a tunneling dielectric layer, a doped conductive layer, a plurality of first electrodes, at least one transmission layer, and at least one diffusion region. The tunneling dielectric layer and the doped conductive layer are arranged over a first surface of the substrate. The doped conductive layer includes main body portions. Each first electrode is disposed on and electrically connected to a side of a corresponding main body portion facing away from the substrate. Each transmission layer is disposed between a corresponding pair of adjacent main body portions. Each diffusion region is partially located in a corresponding transmission layer and extends into the tunneling dielectric layer and the substrate. A doping ion concentration of each diffusion region is greater than a doping ion concentration of the substrate.

20 Claims, 5 Drawing Sheets

(56) References Cited

U.S. PATENT DOCUMENTS

| | | | |
|---|---|---|---|
| 2013/0118571 A1 | | 5/2013 | Shim et al. |
| 2014/0099780 A1 | * | 4/2014 | Neumayer .......... H01L 31/0747 257/E21.134 |
| 2015/0280027 A1 | | 10/2015 | Moors et al. |
| 2016/0197207 A1 | * | 7/2016 | Morioka ......... H01L 31/022425 438/98 |
| 2019/0044018 A1 | | 2/2019 | Kuniyoshi et al. |
| 2019/0245107 A1 | * | 8/2019 | Murao ................ H01L 31/0224 |
| 2019/0031215 A1 | | 10/2019 | Lu et al. |
| 2020/0075789 A1 | | 3/2020 | Löper et al. |
| 2020/0343391 A1 | * | 10/2020 | Choi ................. H01L 31/02168 |
| 2021/0217907 A1 | * | 7/2021 | Chen .............. H01L 31/022425 |
| 2022/0115545 A1 | * | 4/2022 | Huang ........... H01L 31/022466 |
| 2022/0158003 A1 | | 5/2022 | Jin et al. |
| 2022/0158009 A1 | | 5/2022 | Jin et al. |

FOREIGN PATENT DOCUMENTS

| | | | |
|---|---|---|---|
| CN | 204029820 U | * | 12/2014 |
| CN | 107710419 A | | 2/2018 |
| CN | 108110065 A | | 6/2018 |
| CN | 108666376 A | | 10/2018 |
| CN | 208422924 U | | 1/2019 |
| CN | 112466961 A | | 3/2021 |
| CN | 112466962 A | | 3/2021 |
| CN | 112542521 A | * | 3/2021 |
| CN | 113471321 A | | 10/2021 |
| CN | 114068729 A | | 2/2022 |
| CN | 114242803 A | | 3/2022 |
| CN | 216488083 U | | 5/2022 |
| CN | 114709294 A | | 7/2022 |
| DE | 202023101198 U1 | | 5/2023 |
| JP | 2007281044 A | | 10/2007 |
| JP | 2014216652 A | | 11/2014 |
| JP | 2015525961 A | | 9/2015 |
| JP | 2015531550 A | | 11/2015 |
| JP | 2016103642 A | | 6/2016 |
| JP | 2016111357 A | | 6/2016 |
| JP | 2021521631 A | | 8/2021 |
| JP | 7073566 B1 | | 5/2022 |
| JP | 2022081366 A | | 5/2022 |
| WO | 2013125036 A1 | | 8/2013 |
| WO | 2017002927 A1 | | 1/2017 |

OTHER PUBLICATIONS

Zhejiang Jinko Solar Co., Ltd., et al., Extended European Search Report, EP 22199686.1, Aug. 18, 2023, 6 pgs.

Zhejiang Jinko Solar Co., Ltd et al., Extended European Search Report, EP 22199434.6, Aug. 14, 2023, 8 pgs.

Zhejiang Jinko Solar Co., Ltd et al., AU Notice of Acceptance, AU2022246376, May 26, 2023, 4 pgs.

Zhejiang Jinko Solar Co., Ltd., et al., Non-Final Rejection, U.S. Appl. No. 17/960,678, Oct. 6, 2023, 14 pgs.

Zhejiang Jinko Solar Co., Ltd., et al., AU First Office Action, AU 2022241631, Sep. 6, 2023, 7 pgs.

* cited by examiner

US 12,074,230 B2

SOLAR CELL, METHOD FOR MANUFACTURING SOLAR CELL, AND PHOTOVOLTAIC MODULE

CROSS REFERENCE TO RELATED APPLICATIONS

The present application claims the benefit of priority under the Paris Convention to Chinese Patent Application No. 202210938933. X filed on Aug. 5, 2022, which is incorporated herein by reference in its entirety.

TECHNICAL FIELD

The disclosure relates in general to the technical field of solar cells, and more specifically to a solar cell, a method for manufacturing the solar cell, and a photovoltaic module.

BACKGROUND

Solar cells have good photoelectric conversion capabilities. A tunneling oxide layer and a doped conductive layer are generally prepared on a surface of a substrate to suppress carrier recombination on the surface of the substrate in the solar cell and enhance the passivation effect on the substrate. The tunneling oxide layer has good chemical passivation effect, and the doped conductive layer has good field passivation effect. In addition, in order to transport and collect photogenerated carriers generated by the solar cell, electrodes are also prepared on part of the surface of the substrate.

However, the existing solar cells are still low in photoelectric conversion efficiency.

SUMMARY

Embodiments of the disclosure provide a solar cell, a method for manufacturing the solar cell, and a photovoltaic module, which are at least conducive to improving the photoelectric conversion efficiency of the solar cell.

Embodiments of the disclosure provide a solar cell. The solar cell includes a substrate, a tunneling dielectric layer, a doped conductive layer, a plurality of first electrodes, at least one transmission layer, and at least one diffusion region. The tunneling dielectric layer and the doped conductive layer that are arranged over a first surface of the substrate in a direction away from the first surface of the substrate, where the doped conductive layer at least includes a plurality of main body portions arranged at intervals. The plurality of first electrodes arranged at intervals and extending in a first direction. Each first electrode is disposed on a side of a corresponding main body portion facing away from the substrate and is electrically connected to the corresponding main body portion. Each transmission layer of the at least one transmission layer is disposed between a corresponding pair of adjacent main body portions of the plurality of main body portions and is in contact with a side surface of each of the corresponding pair of the adjacent main body portions. Each diffusion region of the at least one diffusion region is partially located in a corresponding transmission layer and extends into the tunneling dielectric layer and the substrate. A doping ion concentration of the each diffusion region is greater than a doping ion concentration of the substrate.

In some embodiments, the each diffusion region includes a first region in the substrate, a second region in the tunneling dielectric layer, and a third region in the corresponding transmission layer, where a doping ion concentration of the first region is less than a doping ion concentration of the second region, and the doping ion concentration of the second region is less than a doping ion concentration of the third region.

In some embodiments, a ratio of the doping ion concentration of the first region to the doping ion concentration of the substrate is in a range of $1\times10^3$ to $2\times10^5$.

In some embodiments, in a direction perpendicular to the first surface, a ratio of a thickness of the first region to a thickness of the substrate is in a range of 0.05 to 2.

In some embodiments, the thickness of the first region is in a range of 10 nm to 200 nm.

In some embodiments, in an arrangement direction of the plurality of main body portions, a width of the first region is in a range of 20 μm to 800 μm.

In some embodiments, a projection of the each diffusion region on a surface of the corresponding transmission layer has a rectangular shape, a circular shape, or a round-like shape.

In some embodiments, there are a plurality of diffusion regions in a respective transmission layer of the at least one transmission layer.

In some embodiments, the at least one diffusion region and the substrate are doped with doping ions of a same type.

In some embodiments, the at least one diffusion region and the substrate are doped with doping ions of different types.

In some embodiments, the substrate is doped with a doping ion of an N-type, and the substrate and the at least one transmission layer are doped with doping ions of a same type.

In some embodiments, a material from which the at least one transmission layer is made is the same as a material from which the doped conductive layer is made.

In some embodiments, there are a plurality of transmission layers between each two adjacent first electrodes, and the plurality of transmission layers are arranged at intervals along the first direction.

In some embodiments, the at least one transmission layer is configured as a plurality of transmission layers, the plurality of transmission layers are arranged at intervals, and there is at least one first electrode between adjacent transmission layers.

In some embodiments, a top surface of the tunneling dielectric layer not covered by the plurality of main body portions is exposed.

In some embodiments, the doped conductive layer includes the plurality of main body portions and at least one connection portion. Each connection portion of the at least one connection portion is connected between the corresponding pair of the adjacent main body portions, and a top surface of the each connection portion away from the first surface is not higher than a top surface of the each of the corresponding pair of the adjacent main body portions away from the first surface.

In some embodiments, the solar cell further includes at least one second electrode, where each second electrode of the at least one second electrode extends in a direction perpendicular to the first direction, and is electrically connected to the plurality of the first electrodes.

Embodiments of the disclosure further provide a photovoltaic module. The photovoltaic module includes at least one cell string each including a plurality of solar cells, at least one encapsulating layer, and at least one cover plate. Each of the plurality of solar cells being a solar cell provided in any of the above embodiments. Each encapsulating layer is configured to cover a surface of the at least one cell string. Each cover plate is configured to cover a surface of a corresponding encapsulating layer of the at least one encapsulating layer facing away from the at least one cell string.

Embodiments of the disclosure further provide a method for manufacturing a solar cell. The method includes the following. A substrate is provided. A tunneling dielectric layer and a doped conductive layer are arranged over a first surface of the substrate in a direction away from the first surface of the substrate. The doped conductive layer at least includes a plurality of main body portions arranged at intervals. At least one transmission layer is formed by forming a respective transmission layer between a corresponding pair of adjacent main body portions, where the respective transmission layer of the at least one transmission layer is in contact with a side surface of each of the corresponding pair of the adjacent main body portions. At least one diffusion region is formed. Each diffusion region of the at least one diffusion region is partially located in a corresponding transmission layer and extends into the tunneling dielectric layer and the substrate, where a doping ion concentration of the each diffusion region is greater than a doping ion concentration of the substrate. A respective first electrode is formed on a side of a corresponding main body portion of the plurality of main body portions away from the substrate to form a plurality of first electrodes. The plurality of first electrodes are arranged at intervals and extend along a first direction, and the respective first electrode is electrically connected to the corresponding main body portion.

In some embodiments, the at least one transmission layer and the at least one diffusion region are doped with doping ions of a same type, and each diffusion region of the at least one diffusion region is formed as follows. Each diffusion region is formed by processing a predetermined region of the corresponding transmission layer with a laser process to diffuse doping ions on a top surface of the predetermined region of the transmission layer into the transmission layer, the tunneling dielectric layer, and the substrate. A doping ion concentration of the each diffusion region is greater than a doping ion concentration of the corresponding transmission layer.

In some embodiments, during the laser process, a laser wavelength used is in a range of 220 nm to 550 nm, a laser power used is in a range of 10 W to 50 W, a laser frequency used is in a range of 200 kHz to 2000 kHz, and a laser pulse width used is in a range of 1 ps to 10000 ps.

BRIEF DESCRIPTION OF THE DRAWINGS

One or more embodiments are described as examples with reference to the corresponding figures in the accompanying drawings and the exemplary description does not constitute a limitation to the embodiments. Unless otherwise stated, the figures in the accompanying drawings do not constitute a proportion limitation.

DETAILED DESCRIPTION OF THE EMBODIMENTS

Figure 1:
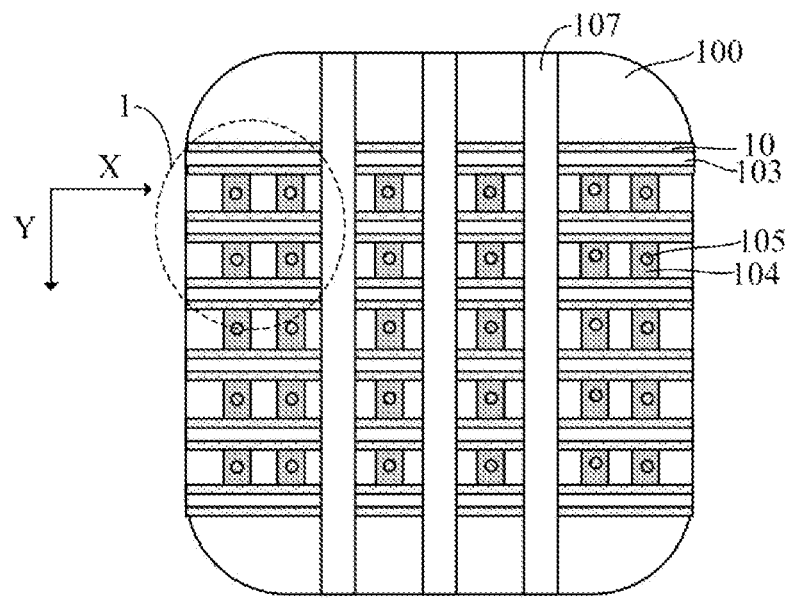
FIG. 1 is a schematic top view of a solar cell according to embodiments of the disclosure.

As discussed in the background art, the existing solar cells are still low in photoelectric conversion efficiency.

The analysis found that one of reasons for the low photoelectric conversion efficiency of the existing solar cells is that: to reduce absorption of light by the doped conductive layer, a doped conductive layer is arranged in a metallized region, and a doped conductive layer corresponding to a non-metallized region generally may be thinned or removed. However, in this way, the transmission capacity of carriers between doped conductive layers respectively corresponding to two adjacent electrodes on the substrate may be reduced. Furthermore, the lower the efficiency the carriers transported between the substrate and the doped conductive layer, the lower the power generation efficiency of the solar cell.

Embodiments of the disclosure provide a solar cell. A corresponding transmission layer is disposed between each two adjacent main body portions of a doped conductive layer and is electrically connected with a side surface of each of the two adjacent main body portions, which may provide a lateral transmission channel between the two adjacent main body portions for majority carriers, thereby improving the transmission efficiency of the carriers transported between the substrate and the doped conductive layer. In addition, a diffusion region is provided, part of the diffusion region is disposed in the transmission layer, and the diffusion region also extends into the tunneling dielectric layer and the substrate. A doping ion concentration of the diffusion region is greater than a doping ion concentration of the substrate. That is, the diffusion region is a heavily doped region to change Fermi level of the substrate around the diffusion region, so that carriers in the substrate around the diffusion region are more easily collected. Therefore, the carriers can arrive the transmission layer through the diffusion region, and are then transported to the doped conductive layer after passing through the transmission layer, thereby improving the transmission capability of the majority carriers. In addition, since the diffusion region extends into the tunneling dielectric layer, the carriers can reach the doped conductive layer through the diffusion region in the tunneling dielectric layer without passing through the tunneling dielectric layer, which may prevent the tunneling medium layer from blocking the carrier transmission and further improve the transmission efficiency of the carriers, thereby improving the photoelectric conversion efficiency of the solar cell.

The embodiments of the disclosure will be described in detail below with reference to the accompanying drawings. However, those of ordinary skill in the art can understand that, in various embodiments of the disclosure, many technical details are set forth in order to provide the reader with a better understanding of the disclosure. However, the technical solutions claimed in the disclosure may be realized even without these technical details and various changes and modifications based on the following embodiments.

Figure 2:
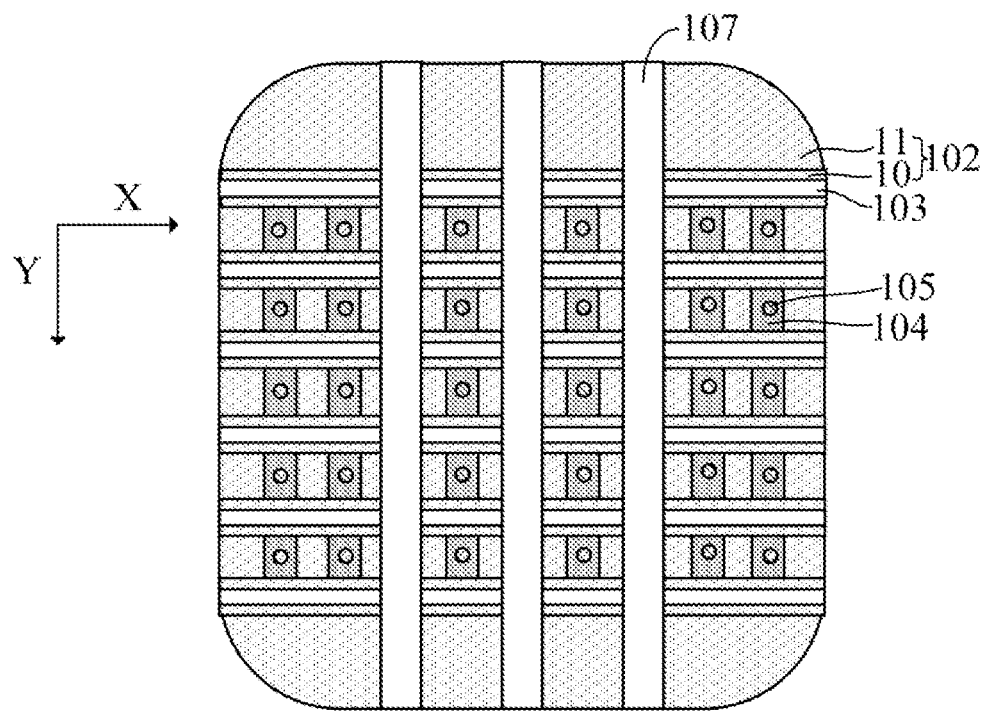
FIG. 2 is a schematic top view of a solar cell according to other embodiments of the disclosure.
Figure 3:
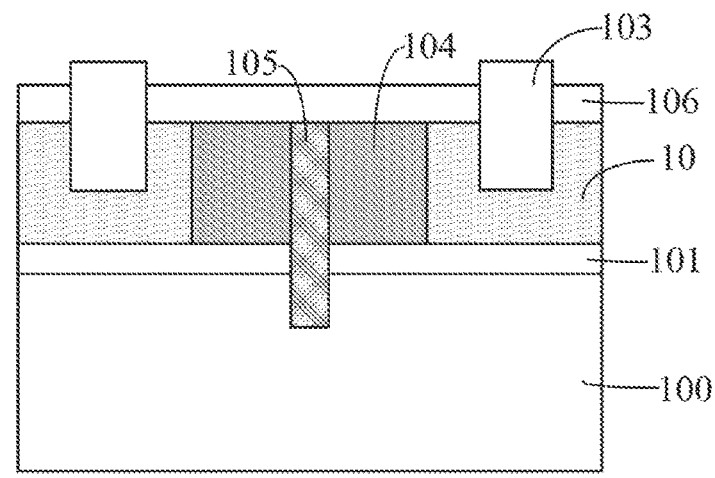
FIG. 3 is a schematic partial cross-sectional view of a solar cell according to embodiments of the disclosure.
Figure 4:
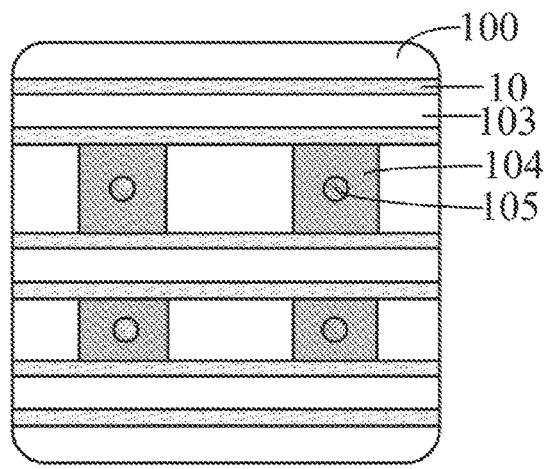
FIG. 4 is a partial enlarged view of part 1 in FIG. 1.

FIG. 1 is a schematic top view of a solar cell according to embodiments of the disclosure. FIG. 2 is a schematic top view of a solar cell according to other embodiments of the disclosure. FIG. 3 is a schematic partial cross-sectional view of a solar cell according to embodiments of the disclosure. FIG. 4 is a partial enlarged view of part 1 in FIG. 1.

As illustrated in FIG. 1 to FIG. 4, a solar cell includes a substrate 100, a tunneling dielectric layer 101, a doped conductive layer 102, a plurality of first electrodes 103, at least one transmission layer 104, and at least one diffusion region 105. The tunneling dielectric layer 101 and the doped conductive layer 102 are sequentially arranged over a first surface of the substrate 100 and in a direction away from the first surface of the substrate 100. The doped conductive layer 102 at least includes a plurality of main body portions 10 spaced apart from one another. The plurality of first electrodes 103 are arranged at intervals and extend in a first direction X. Each first electrode 103 is disposed on a side of a corresponding main body portion 10 facing away from the substrate 100 and is electrically connected to the corresponding main body portion 10. Each transmission layer 104 is disposed between a corresponding pair of adjacent main body portions 10 and is in contact with a side surface of each of the corresponding pair of the adjacent main body portions 10. Each diffusion region 105 is partially located in a corresponding transmission layer 104 and extends into the tunneling dielectric layer 101 and the substrate 100. A doping ion concentration of each diffusion region 105 is greater than a doping ion concentration of the substrate 100.

The substrate 100 is configured to absorb the incident light to produce photogenerated carriers. In some embodiments, the substrate 100 may be a silicon substrate. The silicon substrate may be made of at least one material selected from a group of consisting of single crystal silicon, polysilicon, amorphous silicon, and microcrystalline silicon. In other embodiments, the substrate 100 may be made of silicon carbide, organic materials, or multinary compounds. The multinary compounds may include, but are not limited to, materials such as perovskite, gallium arsenide, cadmium telluride, copper indium selenium, and the like.

In some embodiments, the substrate 100 is doped with a doping element of an N-type or a P-type. The N-type element may be a group-V element such as a phosphorus (P) element, a bismuth (Bi) element, an antimony (Sb) element, or an arsenic (As) element. The P-type element may be a group-III element, such as a boron (B) element, an aluminum (Al) element, a gallium (Ga) element, or an indium (In) element. For example, when the substrate 100 is a P-type substrate, the substrate 100 is doped with the doping element of the P-type. For another example, when the substrate 100 is an N-type substrate, the substrate 100 is doped with the doping element of the N-type.

In some embodiments, the solar cell is a tunnel oxide passivated contact solar cell. The substrate 100 further has a second surface opposite to the first surface. Both the first surface and the second surface may be used to absorb the incident light or reflected light. In some embodiments, the first surface may be a rear surface of the substrate 100, and the second surface may be a front surface of the substrate 100. In some embodiments, the first surface may be the front surface of the substrate 100, and the second surface may be the rear surface of the substrate 100.

In some embodiments, the first surface of the substrate 100 may be a non pyramid-textured surface, such as a layered step shape, so that the tunneling dielectric layer 101 on the first surface of the substrate 100 has a high density and uniformity, and the tunneling dielectric layer 101 has a good passivation effect on the first surface of the substrate 100. The second surface of the substrate 100 may be a pyramid-textured surface, to reduce light reflection of the second surface of the substrate 100 to the incident light, thereby increasing the absorption and utilization of the light.

In some embodiments, the tunneling dielectric layer 101 and the doped conductive layer 102 may form a passivation contact structure on the surface of the substrate 100. By forming the tunneling dielectric layer 101 and the doped conductive layer 102, recombination of carriers on the surface of the substrate 100 can be reduced, thereby increasing an open-circuit voltage of the solar cell and improving the photoelectric conversion efficiency of the solar cell. In addition, the tunneling dielectric layer 101 can also be used to avoid or prevent dopant of the doped conductive layer 102 from diffusing into the substrate 100.

The doped conductive layer 102 is configured to form a field passivation layer, to enable minority carriers to escape from the interface, thereby reducing the concentration of the minority carriers, so that the carrier recombination rate on the interface of the substrate 100 is relatively low, and thus the open-circuit voltage, a short-circuit current, and a fill factor are relatively large, thereby improving the photoelectric conversion performance of the solar cell. In some embodiments, the doped conductive layer 102 and the substrate 100 are doped with doping elements of a same conductivity type. For example, the doped conductive layer 102 may be doped silicon, and the doped silicon may specifically be one or more of doped polysilicon, doped microcrystalline silicon, or doped amorphous silicon.

The doped conductive layer 102 includes the plurality of main body portions 10. The main body portion 10 can be understood as a protruding structure of the doped conductive layer 102. Each main body portion 10 extends along the first direction X. The plurality of main body portions 10 are arranged along a second direction Y. The first direction X is perpendicular to the second direction Y. By enabling the main body portion 10 to be electrically connected to the first electrode 103, the first electrode 103 can easily collect carriers from the substrate 100. In addition, the protruding structure is only provided at a part of the doped conductive layer 102 corresponding to the first electrode 103, thereby reducing the parasitic light absorption effect of the remaining part of the doped conductive layer 102 not corresponding to the first electrode 103 and improving the utilization rate of light by the substrate 100.

As illustrated in FIG. 1, in some embodiments, the doped conductive layer 102 may merely include the plurality of main body portions 10 arranged at intervals. A top surface of the tunneling dielectric layer 101 not covered by the plurality of main body portions 10 is exposed. That is, no doped conductive layer 102 is provided on the surface of the substrate 100 corresponding to a non-metallized region. Compared with a metallized region (i.e., the surface of the substrate 100 corresponding to the first electrode 103), the substrate 100 corresponding to the non-metallized region has a higher absorption utilization rate of the incident light.

In some embodiments, the tunneling dielectric layer 101 may be made of a dielectric material with a tunneling effect, including but not limited to, a silicon oxide material, a silicon nitride material, a silicon oxynitride material, an intrinsic amorphous silicon material, and an intrinsic polysilicon material. Specifically, the tunneling dielectric layer 101 may be formed by a silicon oxide layer including silicon oxide (SiOx). The silicon oxide has good passivation properties, and the carriers can easily tunnel through the silicon oxide layer.

In some embodiments, the tunneling dielectric layer 101 may have a thickness in a range of 0.5 nm to 2.5 nm, particularly 0.5 nm to 2 nm, and further particularly 0.5 nm to 1.2 nm. When the tunneling dielectric layer 101 has the thickness in this range, the tunneling dielectric layer 101 may not be too thin, which may be beneficial to simplify the process of forming the tunneling dielectric layer 101. On the other hand, the tunneling dielectric layer 101 may not be too thick, which may be beneficial to avoid a relatively weak tunneling effect of the tunneling dielectric layer 101 due to the excessively large thickness.

As illustrated in FIG. 2, in some embodiments, the doped conductive layer 102 may include the plurality of main body portions 10 and at least one connection portion 11. Each connection portion 11 is connected between the corresponding pair of the adjacent main body portions 10. A top surface of each connection portion 11 away from the first surface is not higher than a top surface of a corresponding main body portion 10 away from the first surface. In other words, a thickness of a part of the doped conductive layer 102 on the surface of the substrate 100 corresponding to the non-metallized region is thinner than that of the remaining part of the doped conductive layer 102 on the surface of the substrate 100 corresponding to the metallized region, so that the parasitic absorption of the incident light by the part of the doped conductive layer 102 corresponding to the non-metallized region can be reduced. In addition, the at least one connection portion 11 located in the non-metallized region can also provide a transmission channel for majority carriers between the adjacent main body portions 10.

As can be seen, for the case in which the doped conductive layer 102 only includes the main body portions 10, the part of the doped conductive layer 102 corresponding to the non-metallized region is removed. For the case in which the doped conductive layer 102 includes the main body portions 10 and the at least one connection portion, the part of the doped conductive layer 102 corresponding to the non-metallized region is thinned, so that the carrier transport capability of the substrate 100 corresponding to the non-metallized region is relatively weak. Therefore, a corresponding transmission layer 104 is disposed between each two adjacent main body portions 10, which provides a lateral transmission channel between the two adjacent main body portions 10 for the majority carriers, so that the transmission efficiency of the carriers in the substrate 100 transported between the two adjacent main body portions 10 of the doped conductive layer 102 can be improved, thereby improving the fill factor and the photoelectric conversion efficiency of the solar cell.

In addition, in order to improve the transmission efficiency of the carriers between the substrate 100 and the transmission layer 104 to further improve the transmission efficiency of the carriers transported from the transmission layer 104 to the adjacent main body portions 10, at least one diffusion region 105 is further provided. Each diffusion region 105 is partially located in a corresponding transmission layer 104. A top surface of the diffusion region 105 is exposed, i.e., a surface of the transmission layer 104 away from the first surface is substantially flush with a surface of the diffusion region 105 away from the first surface. The diffusion region 105 further extends into the tunneling dielectric layer 101 and the substrate 100. In other words, the diffusion region 105 penetrates through the transmission layer 104 and the tunneling dielectric layer 101 to be in contact with the substrate 100.

Figure 5:
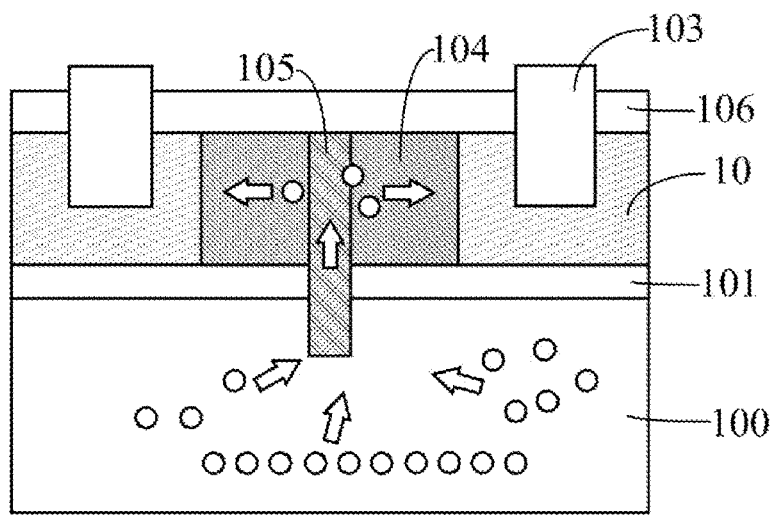
FIGS. 5 and 6 are schematic views of carrier transport in a solar cell according to embodiments of the disclosure.
Figure 6:
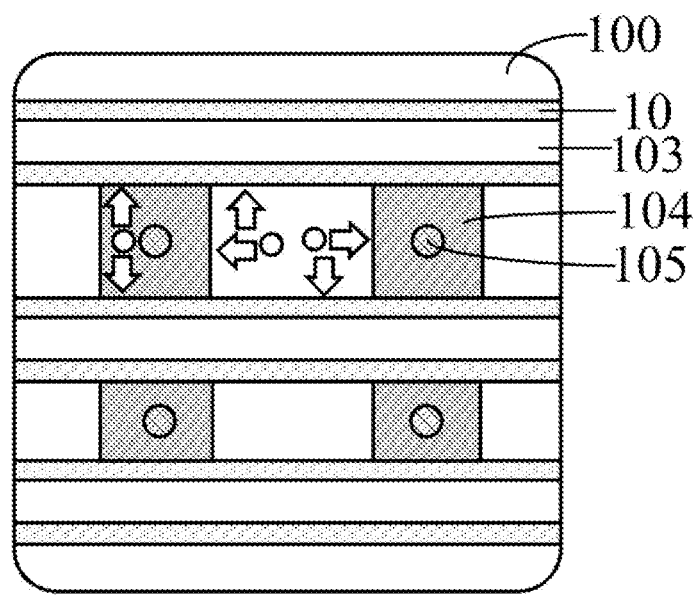

Specifically, FIG. 5 and FIG. 6 illustrate schematic diagrams of the diffusion region facilitating carrier transport. Since a doping ion concentration of the diffusion region 105 is greater than a doping ion concentration of the substrate 100, the Fermi level of the substrate 100 around the diffusion region 105 can be changed, so that the carriers in the substrate 100 around the diffusion region 105 are gathered around the diffusion region 105. Therefore, the carriers in the substrate 100 are more easily collected through the diffusion region 105 and transported to the transmission layer 104, and then transported from the transmission layer 104 to the main body portions 10. Providing the diffusion region 105 is equivalent to providing an additional transmission channel for the carriers in the substrate 100. The carriers in the substrate 100 can directly reach the transmission layer 104 through the diffusion region 105 without passing through the tunneling dielectric layer 101, thereby preventing the tunneling dielectric layer 101 from blocking the carrier transmission and improving the carrier transmission efficiency.

Continue referring to FIG. 1 to FIG. 4, in some embodiments, the diffusion region 105 includes a first region in the substrate 100, a second region in the tunneling dielectric layer 101, and a third region in the transmission layer 104. A doping ion concentration of the first region is less than a doping ion concentration of the second region, and the doping ion concentration of the second region is less than a doping ion concentration of the third region. In other words, in a direction from the substrate 100 to the transmission layer 104, the doping ion concentration of the diffusion region 105 may be increased gradually, so that a concentration gradient of doping ions of a same type is established in the substrate 100, the tunneling dielectric layer 101, and the transmission layer 104, and a direction of the concentration gradient is the same as a transmission direction of the carriers. In this way, a barrier effect may be produced in the diffusion region 105 for the carriers, which can not only effectively collect the carriers and improve the transmission efficiency of the carriers, but also reduce the recombination of the carriers, increase the carrier concentration, and improve the short-circuit current and the open-circuit voltage of the solar cell.

It can be understood that in some embodiments, the doping ion concentration of the third region is greater than a doping ion concentration of the transmission layer 104. That is, compared with the transmission layer 104, the third region of the diffusion region 105 is a heavily doped region, which makes the third region of the diffusion region 105 have a lower square resistance, and thus has a smaller resistance loss. Therefore, the carrier transmission efficiency of the diffusion region 105 is further increased.

The doping ion concentration of the first region is greater than a doping ion concentration of the substrate 100, so that the first region of the diffusion region 105 is a heavily doped region, and the heavily doped region can form a high-low junction with the substrate 100, thereby reducing the recombination of the carriers on the surface of the substrate 100 and increasing the concentration of the carriers. In addition, the Fermi level of the substrate 100 in contact with the heavily doped region is changed, so that the carriers in the substrate 100 in contact with the heavily doped region are more easily collected, so as to improve the transmission rate of the carriers in the substrate 100 transmitted to the doped conductive layer 102. In some embodiments, a ratio of the doping ion concentration of the first region to the doping ion concentration of the substrate 100 is set to $1\times10^3 \sim 2\times10^5$, for example, $1\times10^3 \sim 5\times10^3$, $5\times10^3 \sim 1\times10^4$, $1\times10^4 \sim 2\times10^4$, $5\times10^4 \sim 1\times10^5$, or $1\times10^5 \sim 2\times10^5$. When the ratio of the doping ion concentration of the first region to the doping ion concentration of the substrate is within this range, the first region of the diffusion region 105 and the substrate 100 form the high-low junction to reduce the recombination of the carriers, and the Fermi level of the substrate 100 around the first region can be easily changed, thereby improving the collection efficiency of the carriers in the substrate 100 and the transmission rate of the carriers.

In some embodiments, in a direction perpendicular to the first surface, a ratio of a thickness of the first region of the diffusion region 105 to the thickness of the substrate 100 is 0.05~2, for example, 0.05~0.1, 0.1~0.2, 0.2~0.5, 0.5~0.8, 0.8~1, 1~1.3, 1.3~1.5, 1.5~1.8, or 1.8~2. When the ratio of the thickness of the first region to the thickness of the substrate 100 is within this range, the first region has a relatively deep depth in the substrate 100, so that an area of the substrate 100 in contact with the first region of the diffusion region 105 is relatively large. Therefore, the area of the substrate 100 where the Fermi level is changed is relatively large and more carriers can be collected. In addition, when the ratio of the thickness of the first region to the thickness of the substrate 100 is within this range, the thickness of the first region of the diffusion region 105 is not too large compared to the thickness of the substrate 100, so that the first region does not have too deep depth in the substrate 100, which may prevent the performance of the substrate 100 from being affected due to the excessively large proportion of the heavily doped region in the substrate 100. Therefore, in some embodiments, the first region of the diffusion region 105 may have a thickness in a range of 10 nm~200 nm. Specifically, in some embodiments, the thickness of the first region may be 10 nm~20 nm, 20 nm~50 nm, 50 nm~80 nm, 80 nm~100 nm, 100 nm~130 nm, 130 nm~160 nm, or 160 nm~200 nm.

In some embodiments, along the second direction Y, a width of the first region of the diffusion region 105 is 20 μm~800 μm, and the second direction Y is an arrangement direction of the plurality of main body portions 10. When the width of the first region is within this range, the first region of the diffusion region 105 is relatively wide, so that the area of the substrate 100 in contact with the first region is relatively large, and thus the collection rate of the carriers in the substrate 100 can be increased. In addition, since the width of the first region of the diffusion region 105 is relatively large, the number of the carriers transported through the diffusion region 105 can also be increased, thereby increasing the transmission rate of the carriers. On the other hand, when the width of the first region is within this range, the first region of the diffusion region 105 is not too wide, thereby preventing the Auger recombination of the carriers in the substrate 100 due to the excessively large area of the heavily doped region. Specifically, in some embodiments, the width of the first region of the diffusion region may be in a range of 20 μm to 50 μm, 50 μm to 80 μm, 80 μm to 150 μm, 150 μm to 200 μm, 200 μm to 250 μm, 250 μm to 350 μm, 350 μm to 500 μm, 500 μm to 600 μm, 600 μm to 750 μm, or 750 μm to 800 μm.

It can be understood that, in some embodiments, the width of the third region, a width of the second region, and the width of the first region of the diffusion region 105 are equal. Therefore, by arranging the width of the first region of the diffusion region 105 not too large, the width of the third region and the width of the second region of the diffusion region 105 are also not too large. In this way, it is possible to prevent the overall doping concentration of the transmission layer 104 from being too high due to the excessively large width of the third region located in the transmission layer 104, thereby avoiding a large Auger recombination of the carriers located in the transmission layer 104 and a reduced concentration of doping ions transported into the doped conductive layer 102. In addition, the second region of the diffusion region 105 accounts for a small proportion of the tunneling dielectric layer 101, such that it is possible to avoid affecting the interface passivation performance of the tunneling dielectric layer 101 due to the large area of the second region located in the tunneling dielectric layer 101.

In embodiments of the disclosure, the diffusion region 105 is merely provided in part of the transmission layer 104, part of the tunneling dielectric layer, and part of the substrate 100, that is, the diffusion region 105 is used as a local doped region. Therefore, the diffusion region 105 may be functioned as a carrier transport channel, and normal performance of the transmission layer 104, the tunneling dielectric layer, and the substrate 100 may be maintained, thereby improving the overall photoelectric conversion performance of the solar cell. In some embodiments, a projection of each diffusion region 105 on a surface of the corresponding transmission layer 104 has a rectangular shape, a circular shape, or a round-like shape. It can be understood that there is no restriction on the shape of the projection of the diffusion region 105 on the surface of the transmission layer 104.

In some embodiments, there are a plurality of diffusion regions 105 in each of the at least one transmission layer 104. In this way, the majority carriers in the substrate 100 can be simultaneously provided with a plurality of lateral transmission channels between the two adjacent main body portions 10, so that a rate at which the carriers are transported to the doped conductive layer 102 at a same time can be improved. Specifically, in some embodiments, there are two, three, or four diffusion regions 105 in a same transmission layer 104.

In some embodiments, a doping ion type of the substrate 100 is an N-type. The substrate 100 is doped with doping ions of the N-type, such as phosphorus ions, bismuth ions, antimony ions, or arsenic ions.

In some embodiments, the at least one diffusion region 105 and the substrate 100 are doped with doping ions of a same type. For example, the at least one diffusion region 105 is doped with doping ions of the N-type and the substrate 100 is doped with the doping ions of the N-type. For another example, when the substrate 100 is doped with doping ions of a P-type, the at least one diffusion region 105 is doped with doping ions of the P-type. The diffusion region 105 and the substrate 100 are doped with the doping ions of the same type, and the doping ion concentration of the diffusion region 105 is greater than the doping ion concentration of the substrate 100, so that the diffusion region 105 and the substrate 100 form a high-low junction, and thus the diffusion region 105 can reduce the recombination of the carriers on the interface of the substrate 100, thereby increasing the concentration of the carriers.

In other embodiments, the diffusion region 105 and the substrate 100 are doped with doping ions of different types. For example, when the diffusion region 105 is doped with the doping ions of the N-type, the substrate 100 is doped with the doping ions of the P-type. Alternatively, when the substrate 100 is doped with the doping ions of the N-type, the diffusion region 105 is doped with the doping ions of the P-type. As can be seen, there is no restriction on the type of the doping ions in the diffusion region 105 and the substrate 100, and merely the doping ion concentration of the diffusion region 105 being greater than the doping ion concentration of the substrate 100 needs to be met.

In some embodiments, a material from which the at least one transmission layer 104 is made is the same as a material from which the doped conductive layer 102 is made. By enabling the transmission layer 104 and the doped conductive layer 102 to be made of the same material, the types of materials in the entire production process can be reduced, so as to facilitate management. In addition, by enabling the transmission layer 104 and the doped conductive layer 102 to be made of the same material, the carriers may have a similar or same transmission rate in the transmission layer 104 and the doped conductive layer 102, so that the transmission efficiency of the carriers transmitted from the transmission layer 104 to the main body portions 10 of the doped conductive layer 102 can be improved, and the transmission loss can be reduced. Specifically, in some embodiments, the transmission layer 104 and the doped conductive layer 102 each may be made of at least one material selected from a group of consisting of polysilicon, amorphous silicon, and microcrystalline silicon. In other embodiments, the transmission layer 104 and the doped conductive layer 102 each may be made of one material of doped amorphous silicon, doped polysilicon, and doped microcrystalline silicon.

In some embodiments, there are a plurality of transmission layers 104 between each two adjacent first electrodes 103. The plurality of transmission layers 104 are arranged at intervals along the first direction X. In other words, the plurality of transmission layers 104 are spaced apart from each other, such that a surface of the tunneling dielectric layer 101 between adjacent transmission layers 104 may be exposed, that is, an overall area of the transmission layers 104 may not be too large. Since the transmission layers 104 and the doped conductive layer 102 are made of same materials, when the overall area of the transmission layers 104 is not too large, it is possible to avoid that the substrate 100 has a low utilization rate to the incident light due to the excessive light absorption ability of the transmission layers 104 to the incident light. In addition, by arranging the plurality of transmission layers 104 and providing a corresponding diffusion region 105 in a respective transmission layer 104, it is possible to provide a plurality of transmission channels for the transmission of the majority carriers in the substrate 100 between the adjacent main body portions 10, thereby further improving the lateral transmission capability of the solar cell.

In some embodiments, the at least one transmission layer 104 is configured as a plurality of transmission layers 104. The plurality of transmission layers 104 are arranged at intervals. There is at least one first electrode 103 disposed between adjacent transmission layers 104. In other words, the plurality of transmission layers 104 are arranged along the second direction Y, where the second direction Y is the arrangement direction of the plurality of main body portions 10. Since the first electrode 103 is disposed on the main body portion 10, the first electrode 103 is configured to collect carriers transmitted to the main body portion 10. The more carriers transmitted to the main body portion 10, the more carriers collected by the first electrode 103. The at least one first electrode 103 is arranged between the adjacent transmission layers 104, in other words, the transmission layer 104 is arranged between a plurality of adjacent first electrodes 103, so that the collection efficiency of the carriers by the plurality of first electrodes 103 can be improved. Specifically, along the second direction Y, the at least one first electrode 103 is arranged between the adjacent transmission layers 104. When there is only one first electrode 103 between the adjacent transmission layers 104, there is a corresponding transmission layer 104 disposed between each two adjacent main body portions 10. When there are a plurality of first electrodes 103 disposed between the adjacent transmission layers 104, the transmission layers 104 are discontinuously disposed. For example, in the second direction Y, there is a transmission layer 104 between the first of the first electrodes 103 and the second of the first electrodes 103, and there is no transmission layer 104 between the second of the first electrodes 103 and the third of the first electrodes 103.

In some embodiments, the solar cell further includes a first passivation layer 106. The first passivation layer 106 covers the plurality of main body portions and the at least one transmission layer 104. The first electrode 103 penetrates through the first passivation layer 106 to be electrically connected to the main body portion 10. The first passivation layer 106 is configured to reduce the reflection of the incident light by the substrate 100. In some embodiments, the first passivation layer 106 may be a single-layer or multi-layer structure. The first passivation layer 106 may be made of at least one material selected from a group of consisting of magnesium fluoride, silicon oxide, aluminum oxide, silicon oxynitride, silicon nitride, and titanium oxide.

In some embodiments, the solar cell further includes at least one second electrode 107. Each second electrode 107 extends in a direction perpendicular to the first direction X, and is electrically connected to the plurality of first electrodes 103. The at least one second electrode is configured to gather current collected by the first electrode 103 and transmit the current from the solar cell to the outside.

In some embodiments, the transmission layer 104 and the second electrode 107 are spaced from each other. In this way, the second electrode can be limited by the transmission layer 104, so as to facilitate printing of the second electrode, so that the position of the second electrode can be determined without additional positioning processing, which is convenient for the process production.

In some embodiments, the second surface of the substrate 100 may be provided with an emitter (not illustrated). The emitter and the doped conductive layer 102 may be doped with doping ions of different types. In some embodiments, an antireflection layer may be provided on a surface of the emitter away from the substrate 100, and the antireflection layer may play the role of anti-reflection for the incident light. In some embodiments, the antireflection layer may be a silicon nitride layer, and the silicon nitride layer may be made of a silicon nitride material. In other embodiments, the antireflection layer may be a multi-layer structure, for example, a stacked layer structure including one or more materials selected from silicon nitride, silicon oxide, or silicon oxynitride.

In some embodiments, the second surface of the substrate 100 may also be provided with a structure which is similar to that on the first surface of the substrate 100. For example, a second tunneling dielectric layer and a second doped conductive layer are stacked in sequence over the second surface of the substrate 100 and in a direction away from the second surface of the substrate 100. The second doped conductive layer and the doped conductive layer 102 may be doped with doping ions of different types.

In some embodiments, the solar cell further includes at least one third electrode (not illustrated). The at least one third electrode is disposed on the second surface of the substrate 100. When the emitter is provided on the second surface of the substrate 100, the at least one third electrode penetrates through the antireflection layer to be electrically connected to the emitter. When the second surface of the substrate 100 has a structure similar to that on the first surface of the substrate 100, the at least one third electrode is electrically connected to the second doped conductive layer.

In the solar cell provided in the foregoing embodiments, the transmission layer 104 is arranged between the two adjacent main body portions 10 of the doped conductive layer 102, which may provide a lateral transmission channel between the two adjacent main body portions 10 for the majority carriers and improve the transmission efficiency of the carriers transported between the substrate 100 and the doped conductive layer 102. In addition, the at least one diffusion region 105 is provided, and each diffusion region 105 is partially located in the transmission layer 104, and the diffusion region 105 also extends into the tunneling dielectric layer 101 and the substrate 100. The doping ion concentration of the diffusion region 105 is greater than that of the substrate 100. That is, the diffusion region 105 is a heavily doped region to change the Fermi energy level of the substrate 100 around the diffusion region 105, so that the carriers in the substrate 100 around the diffusion region 105 can be more easily collected, then can reach the transmission layer 104 through the diffusion region 105, and finally are transported to the doped conductive layer 102 through the transmission layer 104, thereby improving the transmission capacity of the majority carriers. Furthermore, the carrier can reach the doped conductive layer 102 through the diffusion region 105 located in the tunneling dielectric layer 101 without passing through the tunneling dielectric layer 101, which further improves the transmission efficiency of the carriers, thereby improving the photoelectric conversion efficiency of the solar cell.

Figure 7:
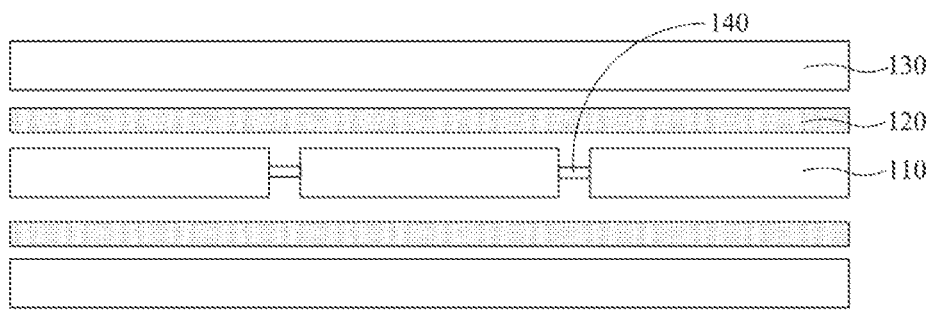
FIG. 7 is a schematic structural view of a photovoltaic module according to embodiments of the disclosure.

Embodiments of the disclosure further provide a photovoltaic module. As illustrated in FIG. 7, the photovoltaic module includes one or more cell strings. Each cell string is formed by connecting a plurality of solar cells 110. Each of the plurality of solar cells 110 is a solar cell provided in the above embodiments. The photovoltaic module further includes at least one encapsulating layer 120 and at least one cover plate 130. Each encapsulating layer 120 is configured to cover a surface of each of the at least one cell string. Each cover plate 130 is configured to cover a surface of a corresponding encapsulating layer of the at least one encapsulating layer 120 facing away from the at least one cell string. The solar cells 110 are electrically connected in the form of a whole piece or multiple pieces to form a plurality of cell strings, and the plurality of cell strings are electrically connected in series and/or parallel.

In some embodiments, the plurality of solar cells can be electrically connected through a conductive tape 140 and the plurality of cell strings can also be electrically connected through a conductive tape 140. The encapsulation layer 120 is configured to cover the front surface and the back surface of the solar cell 110. Specifically, the encapsulation layer 120 may be an organic encapsulation adhesive film such as an ethylene-vinyl acetate copolymer (EVA) adhesive film, a polyethylene octene co-elastomer (POE) adhesive film, or a polyethylene terephthalate (PET) adhesive film. In some embodiments, the cover plate 130 may be a cover plate 130 with a light-transmitting function, such as a glass cover plate, a plastic cover plate, or the like. Specifically, a surface of the cover plate 130 facing the encapsulation layer 120 may be an uneven surface, thereby increasing the utilization rate of the incident light.

Embodiments of the disclosure further provide a method for manufacturing a solar cell. The method for manufacturing the solar cell can form the solar cell provided in the foregoing embodiments of the disclosure. The following may describe in detail the method for manufacturing the solar cell provided by another embodiment of the disclosure with reference to the accompanying drawings.

FIG. 8 to FIG. 13 are schematic views illustrating a respective structure corresponding to each operation of a method for manufacturing a solar cell according to embodiments of the disclosure.

Figure 8:
FIGS. 8 to 13 are schematic views illustrating a respective structure corresponding to each operation of a method for manufacturing a solar cell according to embodiments of the disclosure.

As illustrated in FIG. 8, the substrate 100 is provided.

The substrate 100 is configured to absorb incident light to produce photogenerated carriers. In some embodiments, the substrate 100 is a silicon substrate, and the silicon substrate may be made of at least one material of single crystal silicon, polysilicon, amorphous silicon, and microcrystalline silicon. In other embodiments, the substrate 100 may be made of materials such as silicon carbide, organic materials, or multinary compounds. The multinary compounds may include, but are not limited to, materials such as perovskite, gallium arsenide, cadmium telluride, copper indium selenium, and the like.

In some embodiments, the substrate 100 is doped with a doping element of an N-type or a P-type. The N-type element may be a group-V element such as a phosphorus (P) element, a bismuth (Bi) element, an antimony (Sb) element, or an arsenic (As) element. The P-type element may be a group-III element such as a boron (B) element, an aluminum (Al) element, a gallium (Ga) element, or an indium (In) element. For example, when the substrate 100 is a P-type substrate, the substrate 100 is doped with the doping element of the P-type. For another example, when the substrate 100 is an N-type substrate, the substrate 100 is doped with the doping element of the N-type.

Figure 9:
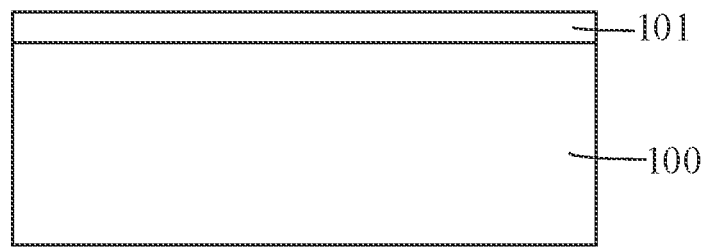
Figure 10:
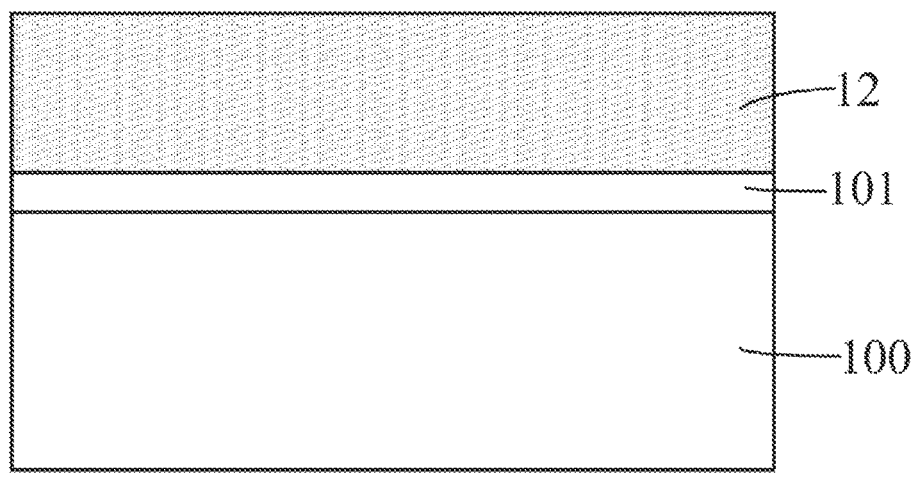
Figure 11:
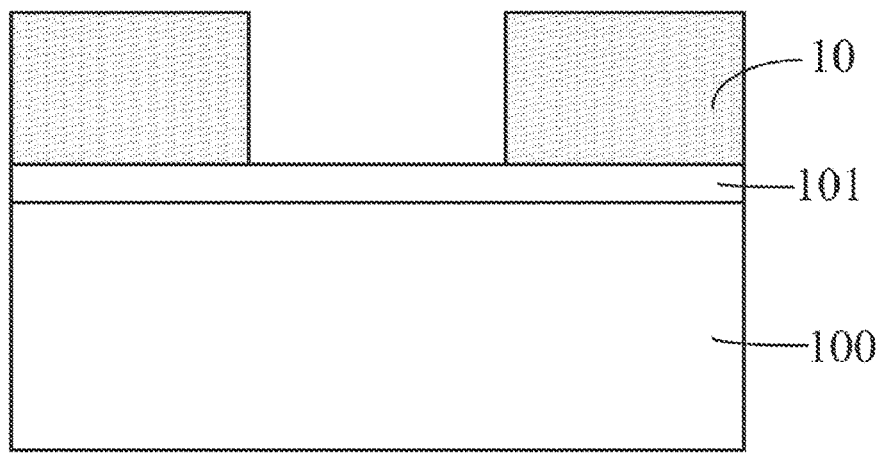

Referring to FIG. 9 to FIG. 11, the tunneling dielectric layer 101 and the doped conductive layer 102 are sequentially arranged over the first surface of the substrate 100 and in the direction away from the first surface of the substrate 100. The doped conductive layer 102 at least includes the plurality of main body portions 10 arranged at intervals.

As illustrated in FIG. 9, the tunneling dielectric layer 101 is used to achieve interface passivation of the substrate 100. In some embodiments, the tunneling dielectric layer 101 may be formed by a deposition process, such as a chemical vapor deposition process. In other embodiments, the tunneling dielectric layer 101 can be formed by an in-situ synthesis process. For example, the tunneling dielectric layer 101 may be an in-situ formed tunneling dielectric layer on the substrate 100 by a thermal oxidation process and nitric acid passivation process. Specifically, the tunneling dielectric layer 101 may be made of a dielectric material, such as silicon oxide.

The doped conductive layer 102 is configured to form field passivation. In some embodiments, the material of the doped conductive layer 102 can be doped silicon. Specifically, in some embodiments, the doped conductive layer 102 and the substrate 100 are doped with doping elements of a same conductivity type. The doped silicon may include one or more of doped polysilicon, doped microcrystalline silicon, or doped amorphous silicon.

In some embodiments, each main body portion 10 may be formed as follows.

As illustrated in FIG. 10, an initial doped conductive layer 12 is formed by the deposition process. Specifically, intrinsic polysilicon can be deposited on a surface of the tunneling dielectric layer 101 away from the substrate 100 to form a polysilicon layer, and the polysilicon layer is doped with doping ions by ion implantation and source diffusion to form a doped polysilicon layer, and the doped polysilicon layer is used as the initial doped conductive layer 12.

As illustrated in FIG. 10 and FIG. 11, a patterning process is performed on the initial doped conductive layer 12. A preset region of the initial doped conductive layer 12 is etched by an etching process, and thus a remaining part of the initial doped conductive layer 12 other than the preset region forms the main body portions 10. In some embodiments, when the doped conductive layer 102 merely includes the plurality of main body portions 10 arranged at intervals, and a top surface of the tunneling dielectric layer 101 between adjacent main body portions 10 is exposed, the preset region of the initial doped conductive layer 12 may be completely etched by the etching process until the top surface of the tunneling dielectric layer 101 is exposed. In other embodiments, the doped conductive layer 102 may include the plurality of main body portions 10 and the at least one connection portion 11. The connection portion 11 is connected between the adjacent main body portions 10, and a top surface of the connection portion 11 away from the first surface is not higher than a top surface of the main body portion 10 away from the first surface. In this case, the preset region of the initial doped conductive layer 12 is etched by the etching process to a predetermined thickness.

Figure 12:
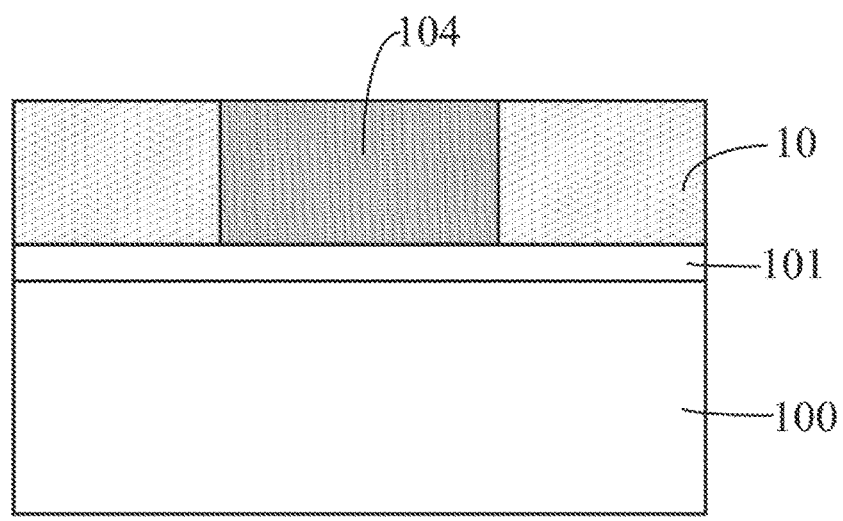

As illustrated in FIG. 12, the corresponding transmission layer 104 is formed between each two adjacent main body portions 10 and is in contact with a side surface of each of the two adjacent main body portions 10. It can be understood that, since the doped conductive layer 102 between the adjacent main body portions 10 is thinned or removed, the carriers in the substrate 100 have poor transport ability between the two adjacent main body portions 10. Therefore, arranging the transmission layer 104 between the two adjacent main body portions 10 provides for the majority carriers a lateral transport channel between the two adjacent body portions 10.

In some embodiments, the transmission layer 104 and the doped conductive layer 102 are made of a same material. Therefore, a method of forming the transmission layer 104 may be the same as the method of forming the doped conductive layer 102. Specifically, an initial transmission layer 104 may be formed between the two adjacent main body portions 10 by adopting a deposition process, and a side wall of the initial transmission layer 104 is in contact with the side surface of the main body portion 10. The initial transmission layer 104 may be an intrinsic polysilicon layer. Thereafter, the initial transmission layer 104 is subjected to a doping process by means of ion implantation and source diffusion, to implant doping ions into the initial transmission layer 104 to form the transmission layer 104.

Specifically, in some embodiments, when the doped conductive layer 102 merely includes the plurality of main body portions 10 spaced apart from each other, the initial transmission layer 104 may be deposited on the surface of the tunneling dielectric layer 101 between the two adjacent body portions 10.

In other embodiments, when the doped conductive layer 102 includes the plurality of main body portions 10 and the at least one connection portion 11, and the connection portion 11 is connected between the adjacent main body portions 10, the initial transmission layer 104 may be deposited on a top surface of the connection portion 11.

Figure 13:
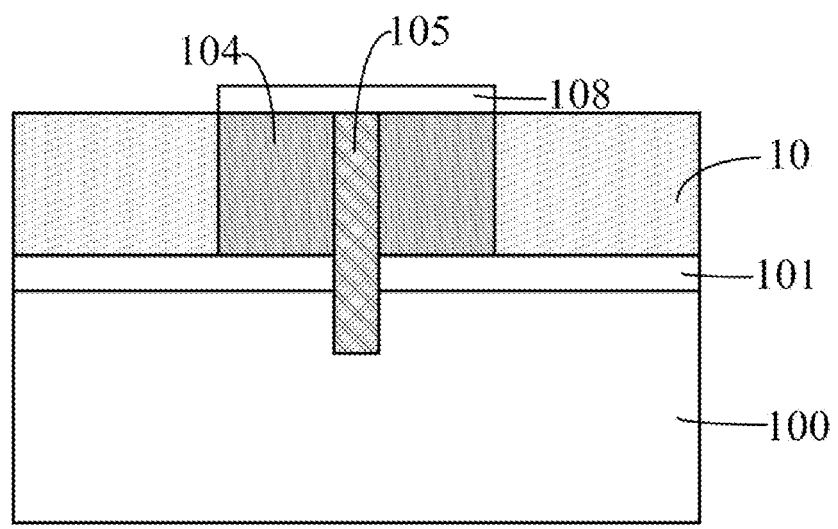

As illustrated in FIG. 13, at least one diffusion region 105 is formed. Each diffusion region is partially located in a corresponding transmission layer 104, and the diffusion region 105 also extends into the tunneling dielectric layer 101 and the substrate 100. The doping ion concentration of each diffusion region 105 is greater than the doping ion concentration of the substrate 100. The diffusion region 105 penetrates through the transmission layer 104 and the tunneling dielectric layer 101 to be in contact with the substrate 100. Since the doping ion concentration of the diffusion region 105 is greater than the doping ion concentration of the substrate 100, the Fermi level of the substrate 100 around the diffusion region 105 can be changed, so that the carriers in the substrate 100 around the diffusion region 105 are concentrated around the diffusion region 105. Therefore, the carriers in the substrate 100 are more easily collected through the diffusion region 105 and transported to the transmission layer 104, and then transported from the transmission layer 104 to the main body portion 10. Providing the diffusion region 105 is equivalent to providing an additional transmission channel for the carriers in the substrate 100. The carriers in the substrate 100 can directly reach the transmission layer 104 through the diffusion region 105 without passing through the tunneling dielectric layer 101, thereby preventing the tunneling dielectric layer 101 from blocking the carrier transmission and improving the carrier transmission efficiency.

In some embodiments, the transmission layer 104 and the diffusion region 105 are doped with doping ions of a same type. Each diffusion region 105 is formed as follows. A predetermined region of the transmission layer 104 is processed by a laser process, to diffuse doping ions on a top surface of the predetermined region of the transmission layer 104 into the transmission layer 104, the tunneling medium layer 101, and the substrate 100 to form the diffusion region 105. The doping ion concentration of the diffusion region 105 is greater than the doping ion concentration of the transmission layer 104. After the doping process is performed on the initial transmission layer 104 to form the transmission layer 104, a doping source concentration of a top surface of the transmission layer 104 is greater than a doping source concentration inside the transmission layer 104. Therefore, after the top surface of the predetermined region of the transmission layer 104 is processed by the laser process, a doping source on the top surface of the predetermined region of the transmission layer 104 may diffuse into the transmission layer 104, the tunneling dielectric layer 101, and the substrate 100 under the thermal effect of the laser. In other words, the doping source on the top surface of the transmission layer 104 after laser processing is diffused into the transmission layer 104, so that the doping ion concentration of the formed diffusion region 105 is greater than that of the transmission layer 104. Since the doping ion concentration of the substrate 100 is less than that of the transmission layer 104, the doping ion concentration of the diffusion region 105 may be greater than the doping ion concentration of the substrate 100.

Specifically, in some embodiments, the substrate is doped with doping ions of the N-type. The substrate and the transmission layer are doped with doping ions of a same type. That is, the transmission layer is also doped with doping ions of the N-type. Therefore, the doping source in the transmission layer may be an N-type doping element, such as a phosphorus element.

As illustrated in FIG. 13, after the transmission layer 104 is formed, a layer of phosphorous silicate glass layer 108 is formed on the top surface of the transmission layer 104 through thermal oxidation treatment. The phosphorous silicate glass layer 108 stores more phosphorus sources.

After the phosphorous silicate glass layer 108 is formed, the laser processing is performed on a preset region of the phosphorous silicate glass layer 108 by a laser process. Since the phosphorous silicate glass layer 108 has a high concentration of phosphorous source, under the thermal effect of the laser process, phosphorus atoms in the phosphorous silicate glass layer can be implanted into the transmission layer 104, the diffusion region 105, and the substrate 100. Therefore, the formed diffusion region 105 and the substrate 100 may be doped with doping ions of the same type. In addition, since the structure of the phosphorous silicate glass layer 108 is relatively hard, the phosphorous silicate glass layer 108 can also protect the top surface of the transmission layer 104 to a certain extent, so as to avoid damage to the top surface of the transmission layer 104 during the laser processing.

In some embodiments, after forming the diffusion region 105, the method further includes: removing the phosphorous silicate glass layer 108.

It can be understood that, in other embodiments, when the type of doping ions in the formed diffusion region needs to be different from the type of doping ions in the substrate, the substrate can be doped with doping ions of the N-type, and the transmission layer 104 can be doped with doping ions of the P-type. That is, the doping source in the transmission layer can be a P-type doping element, for example, a boron element. After the transmission layer is formed, a borosilicate glass layer is formed on the top surface of the transmission layer through thermal oxidation treatment, and more boron sources are stored in the phosphorous silicate glass layer 108.

The diffusion region 105 is formed by the laser process, so that the diffusion region 105 can be formed only in the laser-treated region, and local heavily doping of the transmission layer 104, the tunneling dielectric layer 101, and the substrate 100 can be realized. Therefore, the transmission efficiency of the carriers may be improved, and the normal performance of the transmission layer 104, the tunneling dielectric layer 101, and the substrate 100 can also be maintained.

In some embodiments, a laser wavelength used in the laser process may be 220 nm~550 nm, for example, 220 nm~300 nm, 300 nm~350 nm, 350 nm~400 nm, or 400 nm~550 nm. A laser power used in the laser process may be 10 W~50 W, for example, 10 W~20 W, 20 W~30 W, 30 W~40 W, or 40 W~50 W. A laser frequency used in the laser process may be 200 kHz~2000 kHz, for example, 200 kHz~400 kHz, 400 kHz~800 kHz, 800 kHz~1200 kHz, 1200 kHz~1600 kHz, or 1600 kHz~2000 kHz. A laser pulse width used in the laser process may be 1 ps~10000 ps, for example, 1 ps~1000 ps, 1000 ps~2000 ps, 2000 ps~4000 ps, 4000 ps~6000 ps, 6000 ps~8000 ps, or 8000 ps~10000 ps. Within this range, it can be guaranteed that the doping source on the top surface of the transmission layer 104 may be diffused into the tunneling dielectric layer 101 and the substrate 100 after the laser process, so that a connected transmission channel may be formed in the transmission layer 104, the tunneling dielectric layer 101, and the substrate 100. In addition, the depth and the width of the diffusion region 105 in the substrate 100 can also be controlled by the laser process, so that the shape of the diffusion region 105 can meet expectations.

As illustrated in FIG. 3, in some embodiments, the method further includes the following. The first passivation layer 106 is formed on a side of the main body portions 10 away from the substrate 100. The first passivation layer 106 is disposed on a tope surface of each main body portion 10 and a top surface of each transmission layer 104. In some embodiments, the first passivation layer 106 may be a single-layer or multi-layer structure, and the first passivation layer 106 may be made of at least one material selected from a group of consisting of magnesium fluoride, silicon oxide, aluminum oxide, silicon oxynitride, silicon nitride, and titanium oxide. Specifically, in some embodiments, the first passivation layer 106 may be formed by using a plasma enhanced chemical vapor deposition (PECVD) method.

In some embodiments, after the first passivation layer 106 is formed, a respective first electrode 103 is formed on a side of a corresponding main body portion 10 of the plurality of main body portions 10 away from the substrate 100. The first electrodes 103 are arranged at intervals and extend along the first direction X. Each first electrode 103 is electrically connected to the corresponding main body portion 10.

In some embodiments, each first electrode 103 is formed as follows. Conductive paste is printed on a top surface of the first passivation layer 106 corresponding to the main body portion 10. The conductive material in the conductive paste can be at least one of silver, aluminum, copper, tin, gold, lead, or nickel. The conductive paste is sintered, for example, the conductive paste is sintered at a peak temperature from 750° C. to 850° C., to form the first electrode 103.

In some embodiments, the method further includes the following. At least one second electrode is formed. Each second electrode extends in a direction perpendicular to the first direction X, and is electrically connected to the plurality of the first electrodes 103.

In some embodiments, the method of forming the second electrode may be the same as the method of forming the first electrode 103. Specifically, each second electrode is formed as follows. Conductive paste is printed on a top surface of a specific region of the first passivation layer 106 and each of the first electrodes 103. The conductive material in the conductive paste can be at least one of silver, aluminum, copper, tin, gold, lead, or nickel. The conductive paste is sintered, for example, the conductive paste is sintered at a peak temperature from 750° C. to 850° C., to form the second electrode.

In the method of manufacturing the solar cell provided in foregoing embodiments, the transmission layer 104 is formed between the two adjacent main body portions 10 of the doped conductive layer 102 to provide lateral transport channels for majority carriers between the two adjacent main body portions 10. In addition, the at least one diffusion region 105 is also formed, part of the diffusion region 105 is located in the transmission layer 104, and the diffusion region 105 also extends into the tunneling dielectric layer 101 and the substrate 100. The doping ion concentration of the diffusion region 105 is greater than that of the substrate 100. The diffusion region 105 is used as the heavily doped region to change the Fermi level of the substrate 100 around the diffusion region 105, so that the carriers in the substrate 100 around the diffusion region 105 are more easily collected. Therefore, the carriers can reach the transmission layer 104 through the diffusion region 105, and then be transported to the doped conductive layer 102 through the transmission layer 104, thereby improving the transport capability of the majority carriers.

The foregoing embodiments of the disclosure is disclosed as preferred embodiments, but the foregoing embodiments is not used to limit the claims. Any person skilled in the art can make some possible changes and modifications without departing from the concept of the disclosure. The scope of protection shall be subject to the scope defined by the claims of the disclosure.

Those skilled in the art should appreciate that the embodiments are specific embodiments for implementing the disclosure. In practice, however, various changes may be made in the forms and details of the specific embodiments without departing from the spirit and scope of the disclosure. Any person skilled in the art may make their own changes and modifications without departing from the scope of the dis-

What is claimed is:

1. A solar cell, comprising:
   a substrate;
   a tunneling dielectric layer and a doped conductive layer arranged over a first surface of the substrate in a direction away from the first surface of the substrate, wherein the doped conductive layer is disposed on a surface of the tunneling dielectric layer away from the substrate and comprises a plurality of main body portions arranged at intervals;
   a plurality of first electrodes arranged at intervals, each of the plurality of first electrodes extending in a first direction, wherein each first electrode is disposed on a side, of a corresponding main body portion, facing away from the substrate, and is partially embedded in the corresponding main body portion and electrically connected to the corresponding main body portion;
   at least one transmission layer, wherein each respective transmission layer of the at least one transmission layer is disposed between a corresponding pair of adjacent main body portions of the plurality of main body portions and between a corresponding pair of adjacent first electrodes of the plurality of first electrodes, wherein the respective transmission layer has two opposing sidewalls abutting respective ones of the corresponding pair of the adjacent main body portions and is spaced apart from each of the corresponding pair of adjacent first electrodes, wherein the doped conductive layer and the at least one transmission layer are doped with doping ions of a same type; and
   at least one diffusion region, wherein each diffusion region of the at least one diffusion region is partially located in a corresponding transmission layer and spaced apart from each of the corresponding pair of adjacent first electrodes and includes a first region in the substrate, a second region in the tunneling dielectric layer, and a third region in the corresponding transmission layer, wherein a doping ion concentration of the each diffusion region is greater than a doping ion concentration of the substrate and greater than a doping ion concentration of the corresponding transmission layer.

2. The solar cell of claim 1, wherein a doping ion concentration of the first region is less than a doping ion concentration of the second region, and the doping ion concentration of the second region is less than a doping ion concentration of the third region.

3. The solar cell of claim 2, wherein a ratio of the doping ion concentration of the first region to the doping ion concentration of the substrate is in a range of $1\times10^3:1$ to $2\times10^5:1$.

4. The solar cell of claim 2, wherein in a direction perpendicular to the first surface, a ratio of a thickness of the first region to a thickness of the substrate is in a range of 0.05:1 to 2:1.

5. The solar cell of claim 4, wherein the thickness of the first region is in a range of 10 nm to 200 nm.

6. The solar cell of claim 4, wherein in an arrangement direction of the plurality of main body portions, a width of the first region is in a range of 20 μm to 800 μm.

7. The solar cell of claim 1, wherein a projection of the each diffusion region on a surface of the corresponding transmission layer has a rectangular shape, a circular shape, or a round-like shape.

8. The solar cell of claim 1, wherein there are a plurality of diffusion regions in a respective transmission layer of the at least one transmission layer.

9. The solar cell of claim 1, wherein the at least one diffusion region and the substrate are doped with doping ions of a same type.

10. The solar cell of claim 1, wherein the at least one diffusion region and the substrate are doped with doping ions of different types.

11. The solar cell of claim 9, wherein the substrate is doped with a doping ion of an N-type, and the substrate and the at least one transmission layer are doped with doping ions of a same type.

12. The solar cell of claim 9, wherein a material from which the at least one transmission layer is made is the same as a material from which the doped conductive layer is made.

13. The solar cell of claim 1, wherein there are a plurality of transmission layers between each two adjacent first electrodes, and the plurality of transmission layers are arranged at intervals along the first direction.

14. The solar cell of claim 1, wherein the at least one transmission layer is configured as a plurality of transmission layers, the plurality of transmission layers are arranged at intervals, and there is at least one first electrode between adjacent transmission layers.

15. The solar cell of claim 1, wherein a top surface of the tunneling dielectric layer not covered by the plurality of main body portions is exposed.

16. The solar cell of claim 1, wherein the doped conductive layer includes the plurality of main body portions and at least one connection portion, wherein each connection portion of the at least one connection portion is connected between the corresponding pair of the adjacent main body portions, and a top surface of the each connection portion away from the first surface is not higher than a top surface of the each of the corresponding pair of the adjacent main body portions away from the first surface.

17. The solar cell of claim 1, further comprising:
   at least one second electrode, wherein each second electrode of the at least one second electrode extends in a direction perpendicular to the first direction, and is electrically connected to the plurality of the first electrodes.

18. A photovoltaic module, comprising:
   at least one cell string each comprising a plurality of solar cells;
   at least one encapsulating layer, each encapsulating layer of the at least one encapsulating layer being configured to cover a surface of each of the at least one cell string; and
   at least one cover plate, each cover plate of the at least one cover plate being configured to cover a surface of a corresponding encapsulating layer of the at least one encapsulating layer facing away from the at least one cell string; wherein
   each solar cell of the plurality of solar cells comprises:
   a substrate;
   a tunneling dielectric layer and a doped conductive layer arranged over a first surface of the substrate in a direction away from the first surface of the substrate, wherein the doped conductive layer is disposed on a surface of the tunneling dielectric layer away from the substrate and comprises a plurality of main body portions arranged at intervals;
   a plurality of first electrodes arranged at intervals, each of the plurality of first electrodes extending in a first direction, wherein each first electrode is disposed on a side, of a corresponding main body portion, facing away from the substrate and is partially embedded in the corresponding main body portion and electrically connected to the corresponding main body portion;

at least one transmission layer, wherein each respective transmission layer of the at least one transmission layer is disposed between a corresponding pair of adjacent main body portions of the plurality of main body portions and between a corresponding pair of adjacent first electrodes of the plurality of first electrodes, wherein the respective transmission layer has two opposing sidewalls abutting respective ones of the corresponding pair of the adjacent main body portions and is spaced apart from each of the corresponding pair of adjacent first electrodes, wherein the doped conductive layer and the at least one transmission layer are doped with doping ions of a same type; and at least one diffusion region, wherein each diffusion region of the at least one diffusion region is partially located in a corresponding transmission layer and spaced apart from each of the corresponding pair of adjacent first electrodes and includes a first region in the substrate, a second region in the tunneling dielectric layer, and a third region in the corresponding transmission layer, wherein a doping ion concentration of the each diffusion region is greater than a doping ion concentration of the substrate and greater than a doping ion concentration of the corresponding transmission layer.

19. The photovoltaic module of claim 18, wherein a doping ion concentration of the first region is less than a doping ion concentration of the second region, and the doping ion concentration of the second region is less than a doping ion concentration of the third region.

20. The photovoltaic module of claim 19, wherein a ratio of the doping ion concentration of the first region to the doping ion concentration of the substrate is in a range of $1\times10^3:1$ to $2\times10^5:1$.

* * * * *